United States Patent [19]

Lur et al.

[11] Patent Number: 5,451,804
[45] Date of Patent: Sep. 19, 1995

[54] VLSI DEVICE WITH GLOBAL PLANARIZATION

[75] Inventors: Water Lur, Taipei; Ben Chen, Chu-Tong, both of Taiwan

[73] Assignee: United Microelectronics Corporation, Hsinchu, Taiwan

[21] Appl. No.: 342,020

[22] Filed: Nov. 16, 1994

Related U.S. Application Data

[62] Division of Ser. No. 240,572, May 11, 1994, Pat. No. 5,366,911.

[51] Int. Cl.$^6$ .................. H01L 23/52; H01L 21/8234
[52] U.S. Cl. ..................... 257/330; 257/758; 257/759; 257/752
[58] Field of Search ................. 257/758–760, 257/765, 330–334, 374, 397, 396, 401, 513, 520, 753

[56] References Cited

U.S. PATENT DOCUMENTS

| | | | |
|---|---|---|---|
| 3,665,265 | 5/1972 | Fujimoto | 257/752 |
| 4,333,226 | 6/1982 | Abe et al. | 29/576 B |
| 4,389,481 | 6/1983 | Poleshuk et al. | 430/319 |
| 4,617,193 | 10/1986 | Wu | 427/38 |
| 4,764,484 | 8/1988 | Mo | 437/203 |
| 4,814,285 | 3/1989 | Matlock et al. | 437/24 |
| 4,962,058 | 10/1990 | Cronin et al. | 257/752 |
| 5,063,175 | 11/1991 | Broadbent | 437/192 |
| 5,275,973 | 1/1994 | Gelatos | 437/195 |
| 5,294,562 | 3/1994 | Lur et al. | 437/67 |
| 5,308,786 | 5/1994 | Lur et al. | 437/67 |
| 5,366,925 | 11/1994 | Lur et al. | 437/70 |
| 5,372,968 | 12/1994 | Lur et al. | 437/67 |
| 5,380,671 | 1/1995 | Lur et al. | 257/752 |

FOREIGN PATENT DOCUMENTS

| | | | |
|---|---|---|---|
| 0215723 | 12/1984 | Japan | 437/24 |
| 0136877 | 6/1987 | Japan | 257/332 |
| 000952 | 1/1988 | Japan | 437/24 |

OTHER PUBLICATIONS

"An Advanced Four Level Interconnect Enhancement Module for 0.9 Micron CMOS" by C. A. Bollinger et al., VMIC Conf. Proceedings, Jun. 12–13, 1990, c. 1990 by IEEE, pp. 21–27.
VLSI Technology, International Edition, by SMSZE, McGraw–Hill Book Company, N.Y., N.Y., c 1988 by McGraw–Hill Book Co., pp. 473–474.
"Simulation of Sub–0.1–μm MOSFET's with Completely Supressed Short–Channel Effect" by J. Tanaka et al., IEEE Electron Dev. Letters, vol. 14, No. 8, Aug. 1993, pp. 396–399.
"A New 0.25 μm Recessed–Channel MOSFET with Selectively Halo–Doped Channel and Deep Graded Source/Drain" by W. H. Let et al., IEEE Electron Device Letters, vol. 14, No. 12, Dec. 1993, pp. 578–580.

*Primary Examiner*—William Mintel
*Assistant Examiner*—Peter Toby Brown
*Attorney, Agent, or Firm*—George O. Saile

[57] ABSTRACT

A new method of fabricating an integrated circuit which maintains global planarization throughout the process flow is achieved. Trenched isolation regions are formed within a silicon substrate. Trenched polysilicon gate electrodes are formed within the silicon substrate and within the trenched isolation regions. Source and drain regions are formed within the silicon substrate wherein the top surfaces of the trenched isolation regions, the trenched polysilicon gate electrodes, and source and drain regions form a planarized top surface of the silicon substrate. A pre-metal dielectric layer is deposited over the planarized top surface. Contact openings are formed by etching through the dielectric to the trenched polysilicon gate electrodes and to the source and drain regions. The contact openings are filled with tungsten plugs wherein the top surfaces of the pre-metal dielectric and the tungsten plugs form a planarized top surface of the silicon substrate. A first metal layer is deposited over the planarized top surface. Oxygen ions are implanted into the first metal layer whereby the first metal layer is transformed into an insulator layer except where the layer is covered by photoresist wherein the top surface of the first metal layer forms a planarized top surface of the silicon substrate. The inter-metal dielectric layer and second metal layer are deposited, patterned, and planarized as for the pre-metal dielectric and first metal layers. A passivation layer completes fabrication of the integrated circuit.

7 Claims, 3 Drawing Sheets

VLSI DEVICE WITH GLOBAL PLANARIZATION

This is a division of U.S. patent application Ser. No. 08/240,572, filed May 11, 1994, now U.S. Pat. No. 5,366,911 issued on Nov. 22, 1994 to Water Lur et al.

BACKGROUND OF THE INVENTION

1. Field of the Invention

This invention relates to the fabrication of integrated circuit devices and more particularly to a method of trenched polysilicon gate formation, tungsten-plug contact completion, and implant-induced inter-metal dielectric for improved integrated circuit devices.

2. Description of the Prior Art

The conventional multi-level metallization process in the fabrication of Very Large Scale Integrated (VLSI) circuits suffers from a lack of planarization of the inter-level dielectric. The definition of sub-micron lines requires short wavelength photolithography at the cost of reduced depth of focus. Because of this reduced depth of focus, planarization of the layer to be exposed to photolithography is essential. An unplanarized layer requires a range of depths of focus which are not available in the sub-micron technology.

The step coverage of a metal layer formed by physical vapor deposition (PVD) is closely related to the morphology of the underlayer. More material is deposited on the "hump" than is deposited in the "valley." The larger the aspect ratio of the contact/via openings, the smaller the thickness of the metal sputtered onto the sidewalls and bottoms of the openings. For contact/via openings with a high aspect ratio larger than one, keyholes or voids naturally form in the openings and usually result in circuit failure of the contact/via opening.

In order to fill the contact/via openings with high aspect ratio of larger than one by a PVD method, a high deposition temperature or post-deposition thermal treatment is required. However, these methods suffer from difficulty of process control and sometimes the keyhole or void in the opening is inevitable. Because of these problems, the tungsten-plug process was introduced. The tungsten film can be deposited by chemical vapor deposition (CVD) with conformal step coverage. Alter blanket tungsten CVD and etchback, it is easy to obtain a planarized contact/via filling. Other candidates for this kind of filling include selective tungsten CVD, copper or silver CVD, as well as aluminum CVD. "An Advanced Four Level Interconnect Enhancement Module for 0.9 Micron CMOS" by C. A. Bollinger et al, VMIC Conference Proceedings, Jun. 12-13, 1990, c. 1990 by IEEE, pp.21-27 discusses the use of a tungsten plug for contact window filling.

Even after the metal layer is deposited to an acceptable planarized surface, the morphology still shows a moderate ruggedness after metal pattern definition. The metal thickness cannot be reduced because of circuit performance considerations, but the metal line width and spacing have been reduced considerably in high density VLSI circuits. The aspect ratio of metal line spacings for the deposition of the intermetal dielectric layer is typically larger than one in sub half-micron devices. The planarization of the intermetal dielectric has become an important issue.

Many kinds of intermetal dielectric formation have been adopted to obtain an acceptable planarization. One method is to deposit dielectric conformally and etchback anisotropically many times. Its drawback is throughput and lack of productivity. Another method is to form a layer of spin-on-glass between two CVD oxide layers. The presence of aluminum limits the cure temperature and the uncured moisture in spin-on-glass always results in poisoned via as well as poor adhesion between the CVD oxides. Recently, chemical mechanical polishing (CMP) has been developed to planarize this kind of dielectric layer as well as for the conducting layer. However, the CMP method suffers from many drawbacks such as a complex process, more particles, serious loading effect, long learning time, cost of ownership, maturity, etc.

Local oxidation of silicon is the conventional lateral isolation scheme. The conventional local oxidation process (LOCOS) is described in *VLSI Technology*, International Edition, by S. M. Sze, McGraw-Hill Book Company, NY, N.Y., c. 1988 by McGraw-Hill Book Co., pp. 473–474. A layer of silicon nitride is deposited over a pad oxide overlying a silicon substrate. The pad oxide is a thin thermal oxide which allows better adhesion between the nitride and silicon and acts as a stress relaxation layer during field oxide formation. The nitride and oxide layers are etched to leave openings exposing portions of the silicon substrate where the local oxidation will take place. A boron channel-stop layer is ion implanted into the isolation regions. The field oxide is grown within the openings and the nitride and pad oxide layers are removed. This completes the local oxidation.

A major drawback of conventional local oxidation is a lack of planarization of the oxidized surface of the substrate. Trench isolation methods solve this problem. Typically, deep narrow trenches are used to isolate one device from another. Shallow trenches are used to isolate elements within a device, and wide trenches are used in areas where interconnection patterns will be deposited. U.S. Pat. No. 5,294,562 to Lur et al teaches one method of trench isolation with global planarization. Patent application Ser. Nos. 08/127,061 now U.S. Pat. No. 5,372,968 issued on Dec. 13, 1994 to Water Lur el at, 08/126,87 now U.S. Pat. No. 5,366,925 issued on Nov. 22, 1994 to Water Lur, and 08/127,052 now U.S. Pat. No. 5,380,786 issued on May 3, 1994 to Water Lur et al, all filed on 9/27/93 teach other methods of trench isolation.

The articles, "Simulation of Sub-0.1-$\mu$m MOSFET's with Completely Suppressed Short-Channel Effect," by Junko Tanaka et al, IEEE Electron Device Letters, Vol. 14, No. 8, August 1993, pp. 396–399 and "A New 0.25-$\mu$m Recessed-Channel MOSFET with Selectively Halo-Doped Channel and Deep Graded Source/Drain," by W. H. Lee et al, IEEE Electron Device Letters, Vol. 14, No. 12, December 1993, pp. 578–580, discuss the improved performance and reliability of deep sub-micron devices afforded by trenched gates.

U.S. Patent to Matlock et al teaches the transformation of doped polysilicon or aluminum into an insulator by ion implanting oxygen or nitrogen for the purpose of selective deposition of tungsten or gold in contact/via openings. This method requires the use of a base layer, such as polysilicon. The contact/via formation is by selective deposition using the contact/via stud as a mask.

SUMMARY OF THE INVENTION

A principal object of the invention is to provide an effective and very manufacturable method to maintain global planarization throughout the process flow in the fabrication of an integrated circuit.

Another object of the present invention is to provide a method of local oxidation of silicon that will provide global planarization.

Yet another object is to provide a method of forming an implant-induced interlevel dielectric.

Yet another object of the invention is to provide a method of forming metal patterns without the use of an etching process.

In accordance with the objects of this invention, a new method of fabricating an integrated circuit which maintains global planarization throughout the process flow is achieved. Trenched isolation regions are formed within a silicon substrate. Trenched polysilicon gate electrodes are formed within the silicon substrate and within the trenched isolation regions. Source and drain regions are formed within the silicon substrate wherein the top surfaces of the trenched isolation regions, the trenched polysilicon gate electrodes, and the source and drain region form a planarized top surface of the silicon substrate. A pre-metal dielectric layer is deposited over the planarized top surface of the silicon substrate. Contact openings are formed by etching through the pre-metal dielectric to the trenched polysilicon gate electrodes and to the source and drain regions. The contact openings are filled with tungsten plugs wherein the top surfaces of the pre-metal dielectric and the tungsten plugs form a planarized top surface of the silicon substrate. A first metal layer is deposited over the planarized top surface of the silicon substrate. Oxygen implantation is used to define the metal pattern while maintaining a planarized top surface of the silicon substrate. An inter-metal dielectric layer is deposited over the top planarized surface of the silicon substrate. Via openings are formed by etching through the inter-metal dielectric to the first metal layer. The contact openings are filled with tungsten plugs wherein the top surfaces of the inter-metal dielectric and the tungsten plugs form a planarized top surface of the silicon substrate. A second metal layer is deposited over the planarized top surface of the silicon substrate. Photoresist is coated and developed with a second metal pattern. Oxygen ions are implanted into the second metal layer whereby the second metal layer is transformed into an insulator layer except where the layer is covered by photoresist wherein the top surface of the second metal layer forms a planarized top surface of the silicon substrate. The planarized top surface of the silicon substrate is covered with a passivation layer to complete fabrication of the integrated circuit wherein global planarization is maintained throughout the process flow.

BRIEF DESCRIPTION OF THE DRAWINGS

In the accompanying drawings forming a material part of this description, there is shown.

DESCRIPTION OF THE PREFERRED EMBODIMENTS

Figure 1:
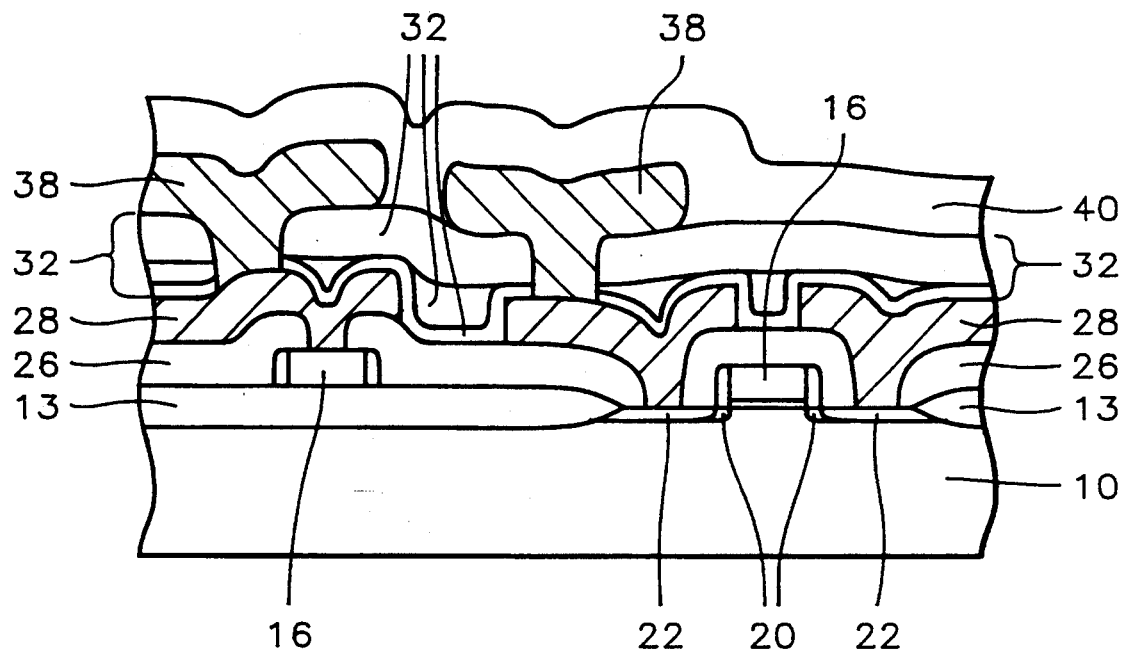
FIG. 1 schematically illustrates in cross-sectional representation a completed integrated circuit of the prior art.

Referring now more particularly to FIG. 1, there is shown a monocrystalline silicon substrate 10. Field oxide regions (FOX) 13 have been formed in and on the semiconductor substrate. Polysilicon gates 16 are formed on the surface of the semiconductor substrate or over the FOX regions. The pre-metal dielectric layer 26 is deposited over the surface of the substrate. Contact or via openings are etched through the dielectric layer 26 and filled with a first metal layer 28 which is patterned as shown. Layers 32 comprise the intermetal dielectric. Openings are etched through the dielectric 32 to contact the first metal layer 28. A second metal layer 38 is deposited and patterned to complete the electrical connection of the integrated circuit. A passivation layer 40 is deposited over all. Notice that the multilayers are not planarized in this prior art process as shown in FIG. 1.

Figure 2:
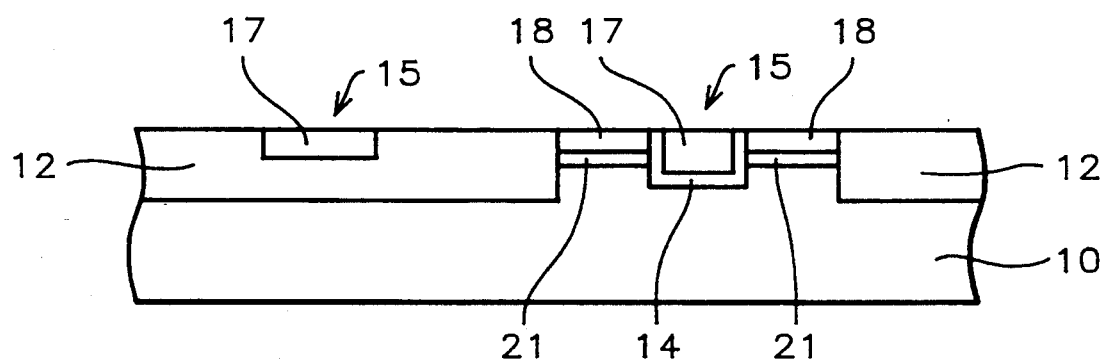
FIGS. 2 through 6 schematically illustrates in cross-sectional representation preferred embodiment of the present invention.

Referring now to FIGS. 2-6, the process of the invention will be described. The process of the invention provides for global planarization at each step of the process. Referring now more particularly to FIG. 2, there is shown a monocrystalline silicon substrate 10. Trenched isolation regions 12 are formed. There are many methods of forming trench isolation regions, such as those cited above. One method is to expose the photoresist partially and leave the photoresist on the isolation area as a mask during dielectric etching as described in U.S. Pat. No. 5,294,562 to Lur et al. The silicon trenches are etched to a depth of between about 6000 to 10,000 Angstroms. A thin silicon oxide is grown to a thickness of between about 50 to 200 Angstroms over the surface of the substrate and within the trenches at a temperature of between about 800° to 900° C. The trenches are refilled with silicon oxide, silicon nitride, or any other dielectric layer with a low dielectric constant. The surface of the substrate is planarized by an etchback or by chemical mechanical polishing (CMP).

Polysilicon lines are defined in the active area and within the field oxide by etching trenches 15 to a depth of between about 3000 to 4000 Angstroms. A gate oxide layer 14 is grown to a thickness of between about 50 to 200 Angstroms within the trenches 15. The trenches are refilled with doped CVD polysilicon or polycide 17 to a thickness of between about 2000 to 3000 Angstroms followed by etchback. This completes formation of the trenched polysilicon (or polycide) gates 17.

Source and drain regions 18 are formed by implantation of arsenic, phosphorus, or antimony ions for NMOS or boron or $BF_2$ ions for PMOS to a dosage of between about $1 E 14$ to $1 E 16$ atoms/$cm^2$ at an energy of between about 10 to 150 KeV. Lightly doped drain (LDD) or doubly doped drain (DDD) structures 21 could be formed simultaneously to improve hot carrier reliability.

Figure 3:
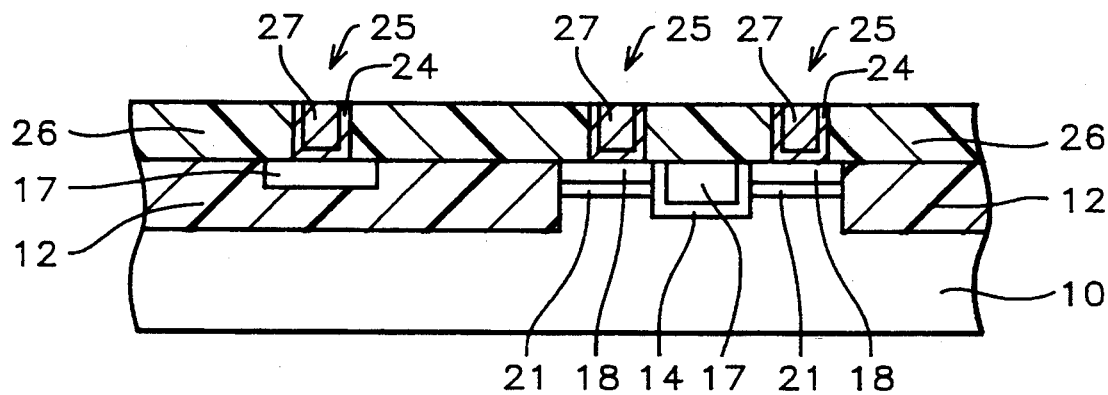

Referring now to FIG. 3, a pre-metal dielectric 26 is deposited over the surface of the semiconductor substrate. Since the surface of the substrate is planarized, the pre-metal dielectric is also planarized. This dielectric layer 26 may be composed of CVD silane based or tetraethoxysilane (TEOS) based borosilicate glass (BSG), phosphosilicate glass (PSG), or borophosphosilicate glass (BPSG) and is deposited to a thickness of between about 4000 to 10,000 Angstroms. The layer 26 is densified at a temperature of between about 800° to 1000° C. for between about 30 seconds to minutes.

A layer of photoresist is deposited over the pre-metal dielectric 26 and patterned to provide openings 25 where contact or via openings are to be made in the layer 26. The layer 26 is etched by reactive ion etching using $CHF_3$, $C_2F_6$, $SF_6$, $O_2$, or the like, where it is exposed to form contact openings 25 to the trenched polysilicon gate and source and drain regions as shown in FIG. 3. The photoresist layer is removed.

The contact holes are filled using selective deposition of tungsten, aluminum, or the like; or blanket tungsten deposition and etchback after glue layer 24 deposition such as titanium/titanium nitride, or titanium tungsten, or the like. The thickness of the contact stud material 27 should be between about 3000 to 8000 Angstroms and the glue layer should be between about 300 to 2000 Angstroms.

Figure 4:
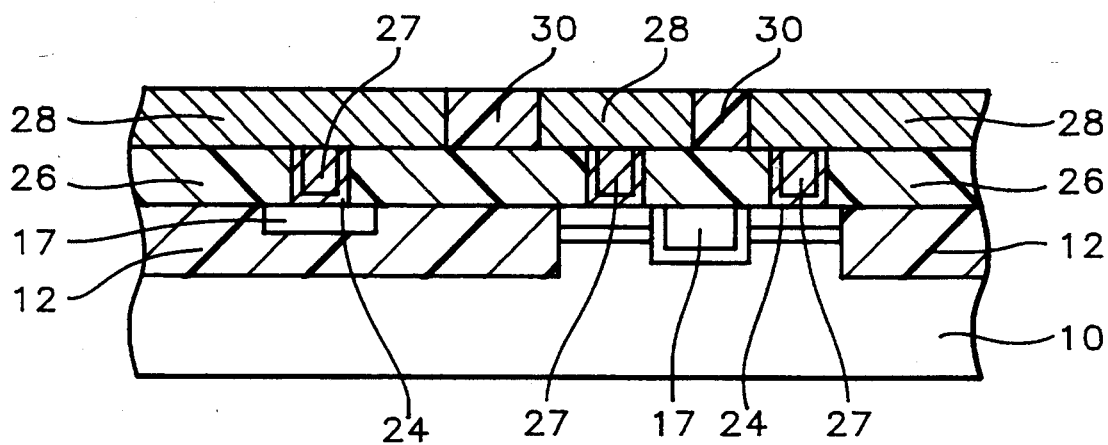

Referring now to FIG. 4, a first metal layer 28 is deposited over the planarized surface of the pre-metal dielectric 26 and tungsten plugs 27. This metal layer uses an aluminum based material deposited by either PVD or CVD to a thickness of between about 4000 to 10,000 Angstroms.

Oxygen implantation is used to define the first metal pattern. Oxygen ions are implanted into those areas 30 not covered by a mask. Oxygen ions are implanted to a dose of between about 1 E 17 to 5 E 18 atoms/cm$^2$ at an energy of between about 30 to 500 KeV. This oxygen implantation transforms the conductor aluminum into the insulator, alumina, or aluminum oxide $Al_xO_y$ 30. Alumina is an insulator with a dielectric constant of between 6.5 to 8.6 and is suitable as an interlevel dielectric in VLSI devices. Other commonly used dielectrics such as silicon dioxide and silicon nitride have dielectric constants of 3.9 and 7.8, respectively.

Figure 5:
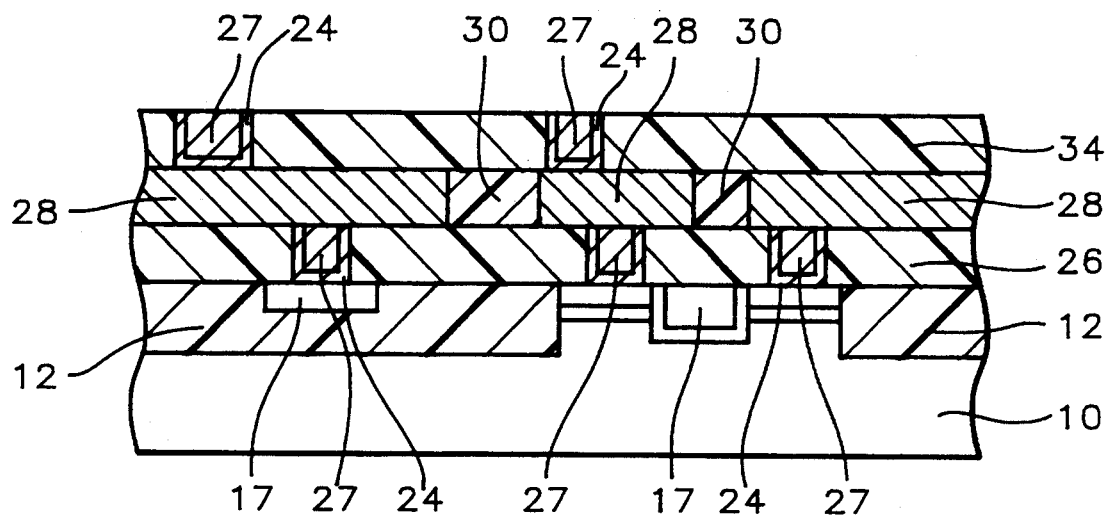

Referring to FIG. 5, an intermetal dielectric layer 34 is deposited over the surface of the substrate. This layer may be composed of CVD silane based or TEOS based silicon oxide or silicon nitride or it may be coated polyimide or spin-on-glass. The layer 34 has a thickness of between about 4000 to 10,000 Angstroms.

Contact or via openings are formed as above using photolithography and reactive ion etching. Since the surface of the substrate is planarized, there is no depth of focus problem for the lithography. The contact openings are filled with tungsten plugs 27 as before. The plugs 27 may be of a different metal such as silver or copper, or the like.

Figure 6:
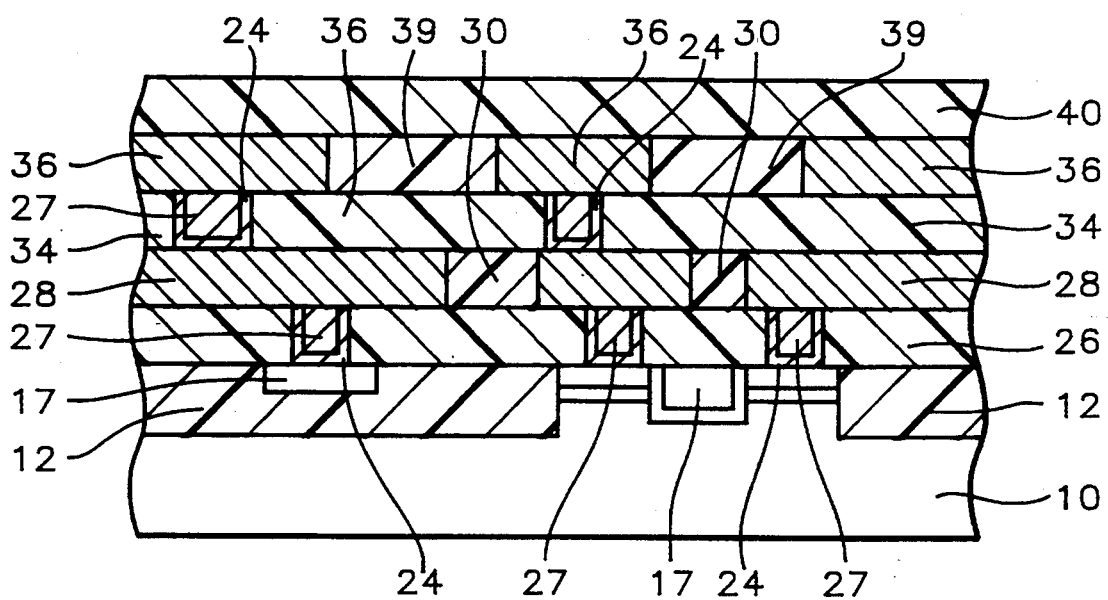

Referring now to FIG. 6, layer 36 is deposited over the planarized surface of the intermetal dielectric 34 and the tungsten plugs 27. This layer is composed of Aluminum or an Aluminum alloy and is deposited by PVD, such as sputtering by DC magnetron plasma or the like, or CVD to a thickness of between about 5000 to 20,000 Angstroms.

Oxygen implantation is used to define the second metal pattern. Oxygen ions are implanted into those areas 39 not covered by a mask. Oxygen ions are implanted to a dose of between about 1 E 17 to 5 E 18 atoms/cm$^2$ at an energy of between about 30 KeV to 1 MeV. This oxygen implantation transforms the conductor aluminum into the insulator, alumina, or aluminum oxide $Al_xO_y$ 39.

A passivation layer 40 is deposited using CVD PSG and/or silicon dioxide and/or silicon nitride or polyimide or the like to a thickness of between about 6000 to 20,000 Angstroms. This completes the formation of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. The integrated circuit device having global planarization comprising:

trenched isolation regions within a silicon substrate;

trenched polysilicon gate electrodes within said silicon substrate and within said trenched isolation regions;

source and drain regions within said silicon substrate wherein the top surfaces of said trenched isolation regions, said trenched polysilicon gate electrodes, and said source and drain regions form a planarized first surface of said silicon substrate;

a pre-metal dielectric layer over said planarized first surface of said silicon substrate;

metal plug contacts within said pre-metal dielectric layer wherein the top surfaces of said pre-metal dielectric and said tungsten plugs form a planarized second surface over said silicon substrate;

a first metal layer over said planarized second surface over said silicon substrate wherein portions of said first metal layer have been transformed into an insulator layer by the implantation of oxygen ions and wherein the top surface of said first metal layer form a planarized third surface over said silicon substrate;

an inter-metal dielectric layer over said third planarized surface over said silicon substrate;

metal plug contacts within said inter-metal dielectric layer wherein the top surfaces of said inter-metal dielectric and said metal plugs form a fourth planarized surface over said silicon substrate;

a second metal layer over said planarized fourth surface over said silicon substrate wherein portions of said second metal layer have been transformed into an insulator layer by the implantation of oxygen ions and wherein the top surface of said second metal layer forms a planarized fifth surface over said silicon substrate; and a passivation layer over said planarized fifth surface completing said integrated circuit device with global planarization.

2. The device of claim 1 wherein said metal plugs are formed by selective deposition of tungsten.

3. The device of claim 1 wherein said metal plugs are formed by selective deposition of aluminum.

4. The device of claim 1 wherein said metal plugs are formed by selective deposition of silver.

5. The device of claim 1 wherein said metal plugs are formed by selective deposition of copper.

6. The device of claim 1 wherein said metal plugs are formed by the steps of:

deposition of a glue layer over the surface of said substrate and within said contact openings;

blanket deposition of a tungsten layer; and etching back said glue layer and said tungsten layer to form a planarized top surface of said silicon substrate.

7. The device of claim 1 wherein said implantation of oxygen ions has a dosage of between about 1 E 17 to 5 E 18 atoms/cm$^2$ and energy of between about 30 KeV to 1 MeV.

* * * * *